United States Patent
Neilson et al.

(10) Patent No.: US 6,856,520 B2
(45) Date of Patent: Feb. 15, 2005

(54) DOUBLE SIDED IGBT PHASE LEG ARCHITECTURE AND CLOCKING METHOD FOR REDUCED TURN ON LOSS

(75) Inventors: John M. Neilson, Norristown, PA (US); Francis J. Kub, Arnold, MD (US); Karl D. Hobart, Upper Marboro, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/441,033

(22) Filed: May 20, 2003

(65) Prior Publication Data

US 2004/0070027 A1 Apr. 15, 2004

Related U.S. Application Data

(60) Provisional application No. 60/381,519, filed on May 20, 2002.

(51) Int. Cl.$^7$ .............................................. H02M 3/335
(52) U.S. Cl. ........................................... 363/16; 363/17
(58) Field of Search ............................ 363/16, 17, 132, 363/98

(56) References Cited

U.S. PATENT DOCUMENTS 5,107,151 A * 4/1992 Cambier .................... 327/432

* cited by examiner

Primary Examiner—Shawn Riley
(74) Attorney, Agent, or Firm—John J. Karasek; Suresh Koshy; Chester Jordan

(57) ABSTRACT

A double-side IGBT (DIGBT) phase leg architecture that uses the DIGBT as a substitute for a free wheeling diode to achieve reduced turn-on loss and reduced reverse recovery peak current during turn-on is described and characterized. Approximately a 50% reduction in reverse recovery peak current and an 80% reduction in recovery charge are achieved. In addition, low power dissipation ($\approx$1 A current level) protection circuitry is described that can be incorporated into the DIGBT phase leg architecture to allow the flow of reverse current even if the gate driver circuit is disabled so that conventional high current free wheeling diodes are not required to provide protection.

11 Claims, 9 Drawing Sheets

PHASE LEG

TWO PHASE LEGS IN SINGLE-PHASE BRIDGE

DOUBLE SIDED IGBT PHASE LEG ARCHITECTURE AND CLOCKING METHOD FOR REDUCED TURN ON LOSS

The present application claim the benefit of the priority filing date of provisional patent application No. 60/381,519 filed on 20 May, 2002.

FIELD OF THE INVENTION

This invention relates in general to semiconductor transistors, and particularly to circuits that allow the efficient employment of double-sided insulated-gate bipolar transistors, also known as DIGBTs.

BACKGROUND OF THE INVENTION

A power MOSFET (Metal-Oxide-Semiconductor Field Effect Transistor) is a semiconductor device containing two regions of a given conductivity type, known as the source region and the drain region, separated from each other by a region of opposite conductivity type, known as the body region. Charge carriers of the given conductivity type can flow between the source and drain through a gate-controllable channel of the given conductivity type extending across a surface of the opposite conductivity type body region. The gate is an electrically conductive electrode situated over an electrically insulating layer of oxide over the surface which contains the channel. Conductivity of the channel, and hence the current flowing between source and drain regions, is changed as changes are made in the voltage at which the gate is biased relative to the body region. The device is known as an N-channel or P-channel MOSFET in accordance with the conductivity type of the source, drain, and channel regions. The device is known as an enhancement-mode or depletion-mode MOSFET in accordance to whether an applied gate bias produces an enhancement or depletion of the conductivity of the channel. An enhancement-mode device is normally off, and does not conduct current unless a bias voltage is applied to the gate. A depletion-mode device is normally on, and will conduct current when no bias voltage is applied to the gate, but this current flow can be interrupted by a bias voltage applied to the gate.

A typical N-channel enhancement-mode MOSFET structure is shown in FIG. 1, and its electrical characteristics are shown in FIG. 2. The device contains an N type source region and an N type drain region, separated from each other by a P type body region. The source, body, and drain regions all intersect a first surface of the structure, while only the drain region intersects a second surface of the structure. A first-surface metal makes contact to the source and body regions on the first surface, and a second-surface metal makes contact to only the drain region on the second surface. The presence of the junction between P body region and N drain region prevents flow of current from second-surface metal to first-surface metal, but the presence of the contact of first-surface metal to P body allows current to flow in the opposite direction, i.e. from first-surface metal to second-surface metal. Overlying the P body region on the first-surface, but separated from it by a layer of insulating oxide, is an electrically conductive gate. When a positive bias is applied to the gate, an N type channel consisting of electron current flow is induced along the surface of the P body region, allowing current to flow between the two N regions. In this way, a small voltage applied to the gate terminal, relative to the N type source potential contacted by first-surface metal, can control a high current at a high voltage between the first-surface and second-surface metals.

Current flowing in a semiconductor can consist of negative charge carriers (electrons), or positive charge carriers (holes), or both. Unipolar conduction consists of only one species of charge carrier, and bipolar conduction consists of both species. Conduction in an N channel MOSFET is unipolar, since it consists of the flow of only electrons.

An N-channel enhancement-mode IGBT (Insulated Gate Bipolar Transistor), is shown in FIG. 3, and its electrical characteristics are shown in FIG. 4. It is structurally identical to the MOSFET, with the exception that the heavily-doped N type drain contact region at the second-surface of the device has been replaced by a heavily-doped P type region. This second-surface P region functions as a P emitter which injects holes into the N type base region. The base of a IGBT is the wide center region of a IGBT in which a wide depletion layer forms to allow a large blocking voltage to be established without avalanche breakdown in the IGBT with the IGBT is in the off-state and a large value blocking voltage is established across the first-surface and second-surface metal terminals of the IGBT. As a result, the IGBT has bipolar conduction, which is a current flow consisting of both holes and electrons in the base, rather than unipolar conduction consisting of a flow of only electrons, as in the N-channel MOSFET. The mobile negative charges (electrons) are balanced by the mobile positive charges (holes), so the carrier concentration in the IGBT can build up to a value several orders of magnitude higher than in the MOSFET through the mechanism of conductivity modulation, with a corresponding reduction in the resistance to current flow, and a corresponding increase in current per unit area. This ability to function at a significantly higher current per unit area is the primary motivation for using an IGBT rather than a MOSFET in any given application.

An N-channel enhancement-mode DIGBT (Double-sided Insulated Gate Bipolar Transistor), is shown in FIG. 5, and its electrical characteristics are shown in FIG. 6. This is structurally identical to the MOSFET and IGBT, with the exception that the heavily-doped N or P type region at the second surface of the device has been replaced by a second MOSFET structure at the second surface. Like the IGBT, the DIGBT can have bipolar conduction in the base because the P body regions of the lower MOSFET at the second surface can act as a P emitter regions, injecting holes into the base region. But unlike the IGBT, the DIGBT can also have unipolar conduction, because when the second-surface gate of the MOSFET at the second surface is turned on, it provides an N type channel path through which the electrons can flow and bypass the second-surface P regions. In addition, when the second-surface gate of the MOSFET at the second surface is turn on, it brings the potential of the N-type base to the potential of the N type source at the second surface thereby turning off the PN junction formed by the P body region and the N-base and halting the hole injection from the P body region at the second surface.

The first surface gate of the DIGBT is the primary gate and the second surface gate of the DIGBT is the secondary gate. The primary gate of the DIGBT controls the turn-on and turn-on of current flow in the channel in the DIGBT by controlling the turn-on and turn-off of the MOSFET at the first surface that injects majority carriers into the base of DIGBT. For an DIGBT with an N-type base region, the primary gate is on the same side of the DIGBT as the cathode terminal. The base of a DIGBT is the wide center region of a DIGBT in which both hole and electron current flow occurs to enable conductivity modulation and a wide depletion layer forms to allow a large blocking voltage to be established without avalanche breakdown in the DIGBT with the DIGBT is in the off-state and a large value blocking voltage is established across the terminals of the DIGBT. The secondary gate is the gate of the DIGBT that controls the injection of minority carriers into the base of the DIGBT. For an DIGBT with an N-type base region, the secondary gate is on the same side of the DIGBT as the anode terminal.

For a given voltage-supporting capability, all 3 devices have the same structure on the first surface, and the same thickness and dopant concentration in the voltage-supporting layer. The difference between the 3 devices lies in the structure of the second surface. In the MOSFET, the second-surface metal makes contact to material having the same conductivity type as the base. In the IGBT, the second-surface metal makes contact to material having the opposite conductivity type to that of the base. In the DIGBT, the second-surface metal makes contact to either the same or the opposite conductivity to that of the base, depending on the status of the second-surface gate.

FIGS. 2, 4, and 6 show the electrical characteristics of these 3 types of devices. Electrical characteristics in the 1st quadrant (the direction in which, on an N-channel device, the second-surface metal is biased positively with respect to the first-surface metal) are governed primarily by the first-surface structure. Since all 3 devices have the same first-surface structure, all 3, when the channel is turned off, have the same 1st quadrant electrical characteristics. Electrical characteristics when the channel is turned on, and the electrical characteristics in the 3rd quadrant, are governed by the second-surface structure, and so are different on these 3 different devices.

FIG. 2 shows the electrical characteristics of an N-channel enhancement-mode MOSFET. With no gate bias applied, the device has the same 1st quadrant blocking characteristics as the IGBT and DIGBT, but in the 3rd quadrant, it supports only the 0.5 to 1 volt of the forward-biased PN junction between body and drain regions. With a positive gate bias applied, the induced N channel produces a continuous N-type conductive path between the metal electrodes of the first and second surfaces, so the electrical characteristic shows an ohmic path which is continuous through the origin. Current can flow in the 1st quadrant only when the gate bias is applied. This current is unipolar, consisting of only electrons. Current can flow in the 3rd quadrant regardless of whether a gate bias is applied. Without a gate bias, the 3rd quadrant current is bipolar. With a gate bias, the 3rd quadrant current is unipolar at low current levels, but can become bipolar at higher current levels if the lateral voltage drop within the device becomes high enough to exceed the 0.5 to 1 volt needed to forward-bias the body-drain junction.

FIG. 4 shows the electrical characteristics of an N-channel enhancement-mode IGBT. With no gate bias applied, this device blocks the flow of 1st quadrant current, just as does the MOSFET. But in the 3rd quadrant, it also blocks the flow of current because the PN junction, which has been added at the second surface, is now reverse-biased. No 3rd-quadrant current flows until the breakdown voltage of this second-surface, 3rd-quadrant, junction is exceeded. Breakdown voltage of the 3rd-quadrant junction is independent of that of the 1st-quadrant junction, and can be made equal to, less than, or greater than the other by changing local dopant concentrations of voltage-supporting regions. Breakdown voltages can be designed to meet the 1st and 3rd quadrant requirements of the intended application. When a positive bias is applied to this IGBT gate, the induced N channel connects the N source to the N drain region just as it does in a MOSFET. But since the second-surface junction is in series with this path, the 1st quadrant current flow is offset from the origin by the voltage drop of this forward-biased second-surface junction. Due to the injection of holes from this junction, the resulting 1st-quadrant current flow in the IGBT is bipolar, and so has a considerably lower voltage drop than does the unipolar 1st-quadrant current of the MOSFET. In the 3rd quadrant, the IGBT blocks the flow of current regardless of whether or not a gate bias is applied.

FIG. 6 shows the electrical characteristics of an N-channel enhancement-mode DIGBT. This device has a first gate (gate 1) on the first surface and a second gate (gate 2) on the second surface, so the electrical characteristics are a function of the status of both gates. When both gates are at zero or negative bias, the DIGBT blocks the flow of current in both directions, up to the avalanche breakdown voltage. As in the IGBT, the breakdown voltage of the 3rd-quadrant junction is independent of that of the 1st-quadrant junction, and can be made equal to, less than, or greater than the other by changing the local dopant concentrations, and can be designed to meet the requirements of the intended application.

When a positive bias is applied to gate 1 while gate 2 is held at zero, the electrical characteristics of the DIGBT are identical to the IGBT: bipolar current flows in the 1st quadrant, but no current flows in the 3rd quadrant. When a positive bias is applied to gate 2 while gate 1 is held at zero, the electrical characteristics are identical to an IGBT in the opposite direction: bipolar current flows in the 3rd quadrant, but no current flows in the 1st quadrant.

When positive biases are applied to both gates of the DIGBT, current can flow in both directions, but this current becomes a unipolar flow, like a MOSFET, rather than a bipolar flow. The current becomes unipolar because the N channel on one surface allows only electrons to enter, and the N channel on the opposite surface allows those electrons to exit without having to cross a junction, and hence without injecting any holes. Actually, at very high current levels, there may be some hole injection because the lateral voltage drops within the device may become high enough to locally forward-bias some of the PN junctions. The current level at which this occurs will depend on the geometry and dopant concentrations of the particular device.

This ability of the DIGBT to conduct by either bipolar or unipolar flow is the reason the DIGBT has advantages over MOSFETs and IGBTs. Bipolar conduction allows current to flow with a much lower voltage drop, less-power dissipation, than unipolar conduction. This is why current per unit area capability of an IGBT is much higher than of a MOSFET. But bipolar conduction leaves the device with a quantity of stored minority carrier charge in the base which must be removed before the device can interrupt, or turn off, the current flow, so this is why IGBTs are slower to turn off and have more switching dissipation than MOSFETs. The advantage of the DIGBT is that through appropriate control of the gate biases, it can conduct like an IGBT and yet can turn off like a MOSFET. This is accomplished by turning on only one gate (the primary gate) while the device is conducting, then turning on both gates (the primary and secondary gates) for a short time just prior to turning off the device (by turning off the primary gate). While only one gate is on, there is bipolar current flow with its low voltage drop, but when both gates are turned on, this changes to a unipolar flow. The voltage drop increases as the carrier concentration drops to the unipolar level, but this is for only a short time just before turn-off, and the reduced minority carrier concentration in the base results in a faster turn-off and reduced switching dissipation, for a net reduction in power losses in the device.

Commonly-used terminology for the MOSFET refers to the first-surface metal terminal as the Source, the second-surface metal terminal as the Drain, and the control electrode as the Gate. Commonly-used terminology for the IGBT refers to the first-surface metal terminal as the Emitter, the second-surface metal terminal as the Collector, and the control electrode as the Gate. Terminology for the DIGBT is not yet well-established, but an appropriate system seems to be to refer to the first-surface metal as Terminal 1, second-surface metal as Terminal 2, and the control electrodes as Gate 1 and Gate 2. Terminal 1 is the reference terminal for Gate 1 (primary gate), and Terminal 2 is the reference terminal for Gate 2 (secondary gate). When the voltage-blocking capability is higher in one direction than the other, Gate 1 (primary gate) is the gate which controls current flow in the higher-voltage direction.

FIG. 7 shows an individual phase-leg, also known as a half-bridge, a basic circuit in which MOSFETs, IGBTs, and DIGBT's can be used. Also shown in FIG. 7 is a single-phase bridge, made up of two phase-legs.

FIG. 8 shows a 3-phase bridge, made up of 3 phase-legs. The individual phase-leg (half-bridge) consists of two switches, referred to as switch A and switch B, and two rectifier diodes, referred to as diode A and diode B. The switches could be any of the 3 devices being discussed, or any other switching device. Phase-legs can be connected together in various types of bridge circuits to produce variable-voltage, variable-frequency, single-phase or multi-phase AC power for electric motors or any other high-power loads.

In operation, the DC supply is connected to opposite ends of the legs, and the load is connected between centers of the legs. In the single-phase bridge of FIG. 7, voltage is applied to the load by simultaneously turning on switches A & D, or B & C. Direction of the load current is determined by which pair of switches has been turned on. The AC load frequency is governed by the rate at which load current direction is being changed from pair A & D to pair B & C and back.

While current is flowing through a given pair, say pair A & D for example, the magnitude of the voltage being applied to the load is controlled by rapidly turning the pair A & D on and off, at a frequency which is high compared to the AC frequency being applied to the load. This may be referred to as the "drive" mode for pair A & D, because during this time, the voltage on the load is established by the ratio of on-time to off-time of the A & D pair. While pair A & D is in the drive mode, pair B & C is in what may be called the "freewheeling" mode. During the time pair A & D is on, energy is being transferred from the supply to the load, and during the time pair A & D is off, energy is being transferred from the load back to the supply by means of current flowing through the diodes of pair B & C.

FIG. 9 shows the current and voltage waveforms for an example of the operation of a phase-leg circuit. In this example, the circuit is being switched at a rate which applies a quasi-sinusoidal alternating current to an inductive load, such as an electric motor. With this type of circuit, motor speed can be varied by varying the AC frequency, and torque can be varied by varying the voltage through changes in the on-time to off-time ratio.

When a given switch-plus-diode set in a given leg is in the drive mode, this set is alternating between 1st-quadrant conduction and 1st-quadrant blocking, at a rate determined by the gate signals being applied to this given set. Meanwhile, the other set is in the freewheeling mode.

When a given switch-plus-diode set in a given leg is in the freewheeling mode, this set is alternating between 1st-quadrant blocking and 3rd-quadrant conduction, at a rate determined by the gate signals being applied to the other set. Meanwhile, the other set is in the drive mode.

When switch A is conducting during the drive mode, the 1st quadrant current through switch A is flowing through the load, and the full supply voltage is applied to the load, to switch B, and to diode B. To control the voltage on the load, switch A is momentarily turned off. When this happens, the current through switch A stops, but the load inductance keeps the load current flowing by generating enough Ldi/dt voltage, in the 3rd quadrant, to exceed the supply voltage and push this current back into the supply, through diode B, which becomes forward biased by the load-generated voltage.

FIG. 10 shows a phase-leg using only MOSFETs, and the corresponding waveforms. When MOSFETs are used as the phase-leg switches, no external diodes are needed, because as described above and as shown in the MOSFET electrical characteristics, the MOSFET itself conducts in the 3rd quadrant, and thereby performs both the switching and the freewheeling functions. When IGBTs are used as phase-leg switches, as shown in FIG. 11, they require external freewheeling diodes because IGBTs have no 3rd quadrant conduction.

Power losses in phase-leg circuit operation fall into 3 categories: (1) conduction losses, due to the voltage drop on the switch while it is conducting, (2) turn-on losses, due to the current-voltage-time product as the switch makes the transition from off-state to on-state, and (3) turn-off losses, due to the current-voltage-time product as the switch makes the transition from on-state to off-state.

Reduction of the conduction losses is the primary motivation for using IGBTs or DIGBTs rather than MOSFETs in phase-legs. Conduction losses in the IGBT and DIGBT, which have bipolar conduction, are lower than in the MOSFET, which has only unipolar conduction. However, turn-off losses are higher for the IGBT and DIGBT due to the longer turn-off time caused by the bipolar conduction.

Turn-on losses are primarily a function of the recovery time of the freewheeling diode, because like the IGBT and DIGBT, the diode also has bipolar conduction, regardless of whether it is an external diode or a built-in diode (body diode) of a MOSFET. While the switch is off, the diode is carrying the freewheeling current through bipolar conduction, and is accumulating a stored charge. When the switch again turns on, direction of current through the diode abruptly reverses and flows without impedance until the diode loses its stored charge and recovers its blocking capability. During this interval, the switch and diode are both highly conductive, and are in series directly across the supply with very little impedance to limit the current. Therefore the current of the diode adds to the current of the MOSFET that is turning on and the total current can rise to values higher than the load current and can cause a high dissipation of energy in the switch that is turning on as well as in the diode. As the diode does recover, the rapidly rising voltage on it can also sometimes cause damage to dielectrics.

Conduction losses and turn-on losses can be reduced by use of an IGBT+MOSFET phase-leg as shown in FIG. 12. In this phase-leg, the diodes have been replaced by MOSFETs. As noted above, MOSFETs have built-in diodes, which can perform the freewheeling function. If these MOSFETs are used purely as ordinary diodes, they have the same bipolar conduction, recovery time, and turn-on losses as ordinary diodes. But the MOSFET diodes have an advantage in that when their gate is turned on during diode conduction, the conduction changes from bipolar to unipolar. Therefore, if the gate remains off during most of the freewheeling conduction, but is turned on just before the freewheeling conduction is to be ended, the stored charge and recovery time can be reduced, and the turn-on energy dissipation can be reduced. Conduction losses of the IGBT+MOSFET can be slightly less than the IGBT+diode because the MOSFET can be turned on during the drive-conduction part of the cycle, allowing the MOSFET to carry possibly 10 to 20% of the load current. Turn-off losses can also be reduced in this type of phase-leg, because the MOSFET can be used to reduce turn-off dissipation. This can be done by allowing the MOSFET to remain on beyond the turn-off of the IGBT gate, thereby minimizing the rise in voltage while the IGBT is losing its stored charge and recovering its blocking capability. Then when the MOSFET is turned off, current is cut off more rapidly, resulting in a smaller current-voltage-time product.

Reduction of turn-off losses has been the primary motivation for using DIGBTs instead of IGBTs. To accomplish this, DIGBTs could be directly substituted for the IGBTs in the circuits of FIGS. 11 and 12, and adding the appropriate drive for gate 2. FIG. 13 shows a phase-leg in which the IGBTs of the FIG. 11 circuit have been directly replaced by DIGBTs. As noted above, conduction in the IGBT is always bipolar, while in the DIGBT it can be unipolar or bipolar, depending on the gate biases. When the DIGBT is used as in FIG. 13, it has only gate 1 turned on during most of the conduction cycle, and during this time, it has bipolar conduction. Gate 2 is then turned on just before gate 1 is to be turned off. With both gates on, conduction changes from bipolar to unipolar, so there is less stored charge remaining when gate 1 is turned off, resulting in a shorter turn-off time and less turn-off energy dissipation. DIGBTs could also be substituted for the IGBTs in the circuit of FIG. 12, in which the turn-on losses were reduced by replacing the diodes with MOSFETs.

It is desirable to employ a circuit architecture that further reduces conduction and turn-off losses while simultaneously eliminating the need either diodes or MOSFETs.

SUMMARY OF THE INVENTION

Disclosed is a double-side IGBT (DIGBT) phase leg architecture that uses the DIGBT as a substitute for a free wheeling diode to achieve reduced turn-on loss and reduced reverse recovery peak current during turn-on is described and characterized. Approximately a 50% reduction in reverse recovery peak current and an 80% reduction in recovery charge are achieved. In addition, low power dissipation ($\approx$1 A current level) protection circuitry is described that can be incorporated into the DIGBT phase leg architecture to allow the flow of reverse current even if the gate driver circuit is disabled so that conventional high current free wheeling diodes are not required to provide protection.

DETAILED DESCRIPTION

Figure 1:
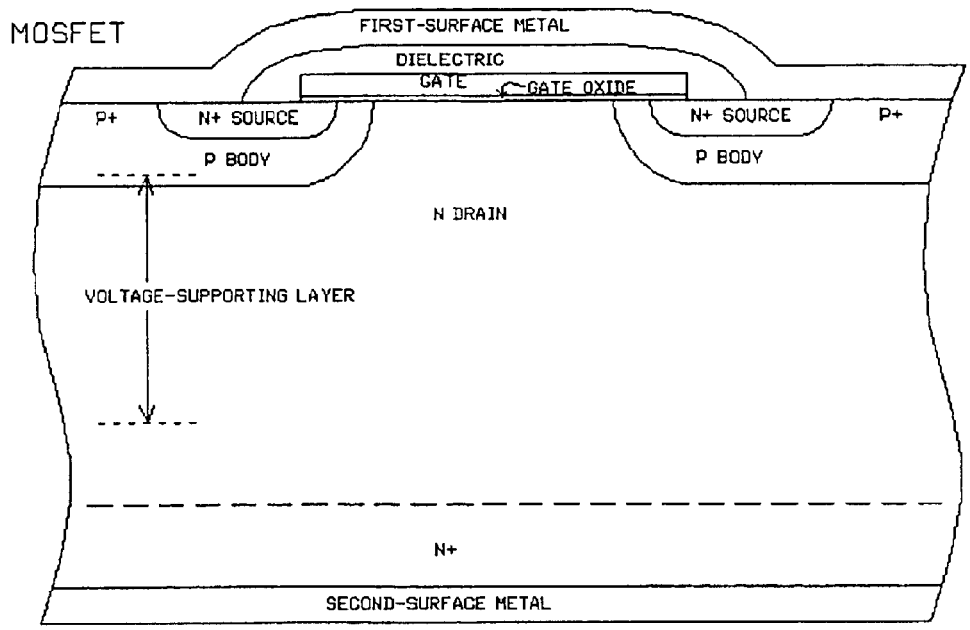
FIG. 1 shows a Cross Section of an N-Channel Enhancement-Mode MOSFET.
Figure 2:
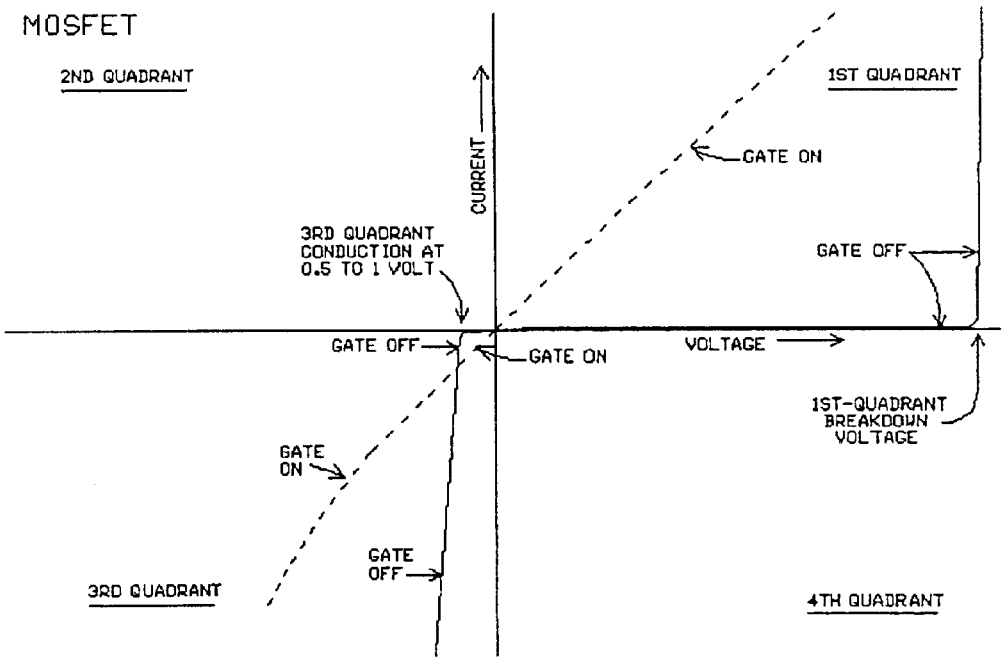
FIG. 2 shows a graph of Current vs. Voltage for N-Channel Enhancement-Mode MOSFET.
Figure 3:
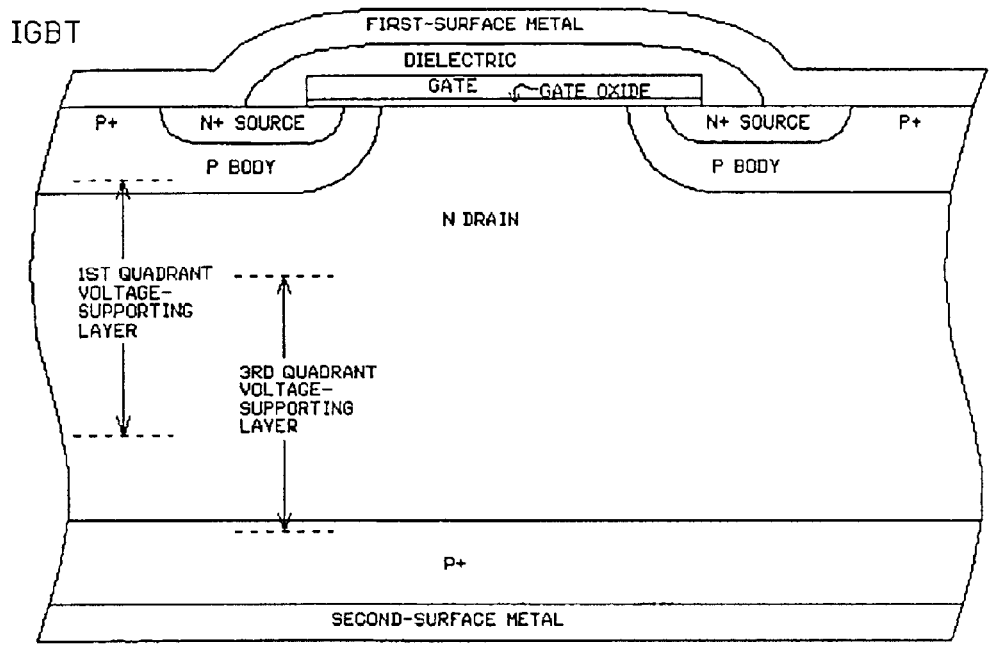
FIG. 3 shows a Cross Section of an N-Channel Enhancement-Mode IGBT.
Figure 4:
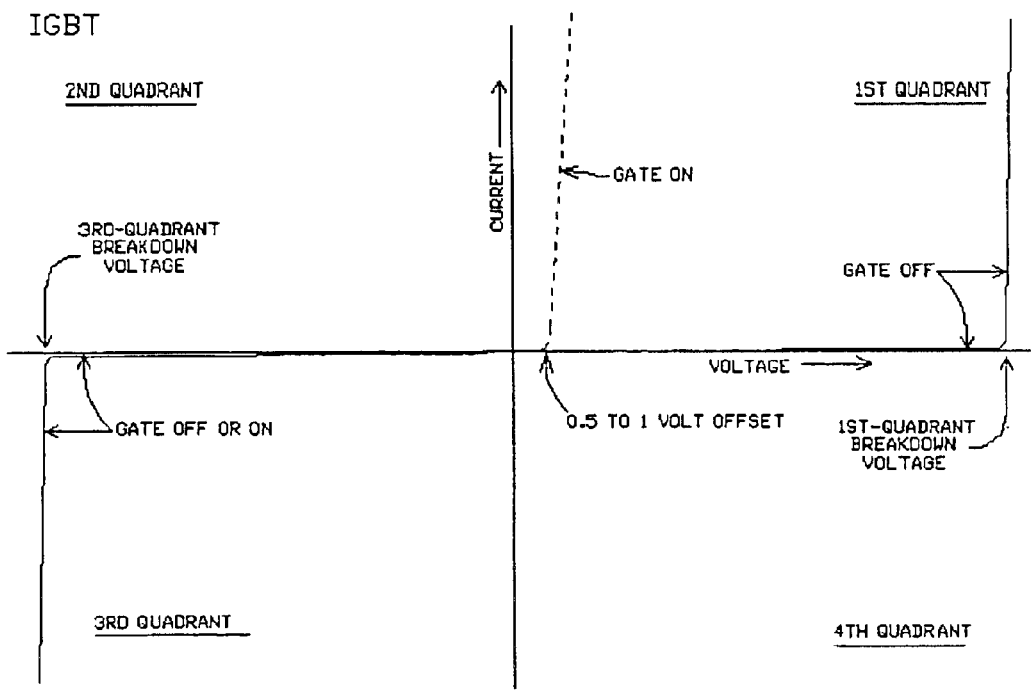
FIG. 4 shows a graph of Current vs. Voltage for N-Channel Enhancement-Mode IGBT.
Figure 5:
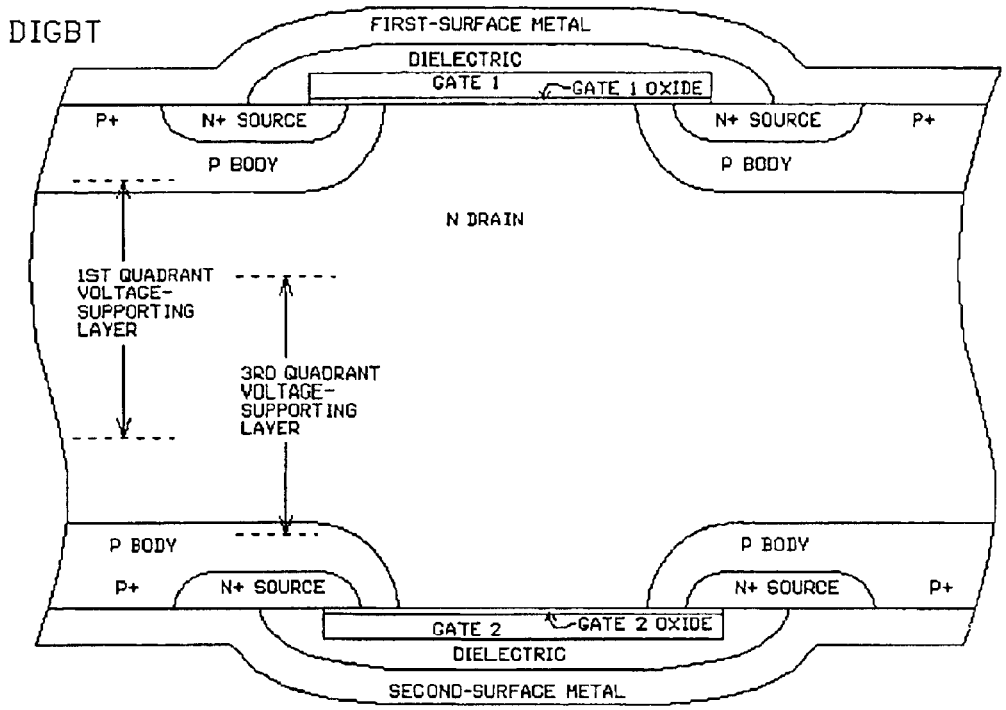
FIG. 5 shows a Cross Section of an N-Channel Enhancement-Mode DIGBT.
Figure 6:
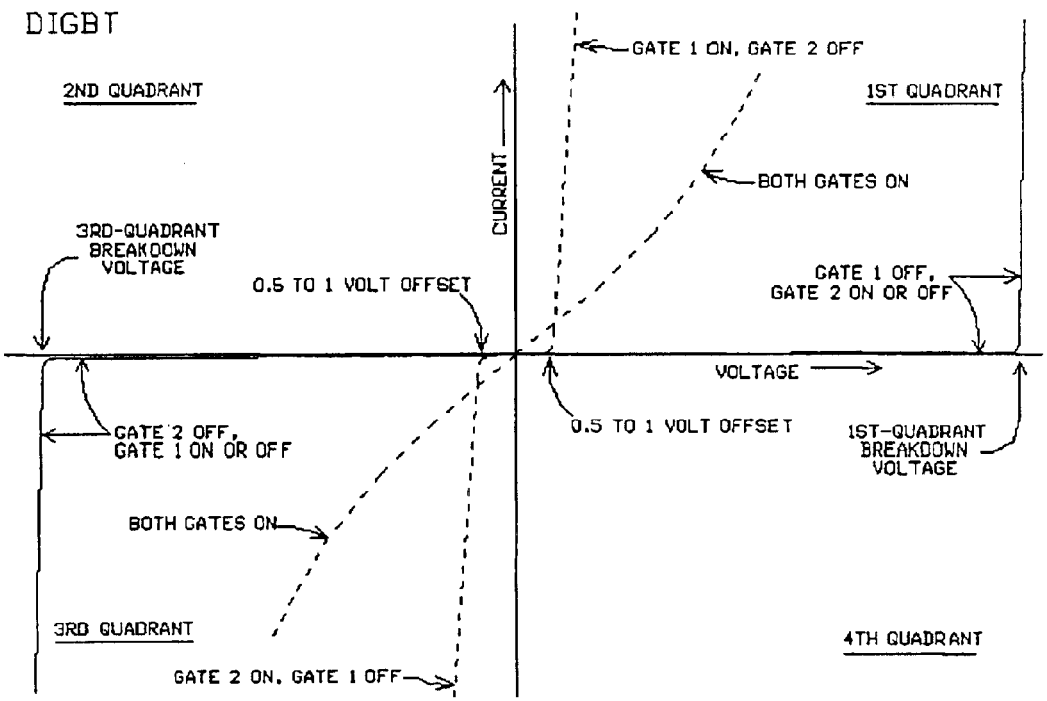
FIG. 6 shows a graph of Current vs. Voltage for N-Channel Enhancement-Mode DIGBT.
Figure 7A:
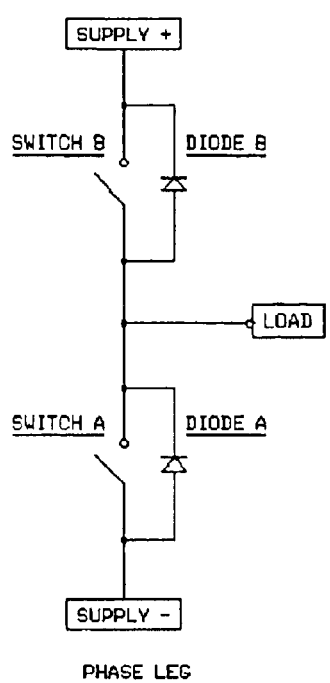
FIG. 7A shows an Individual Phase-Leg Circuit.
Figure 7B:
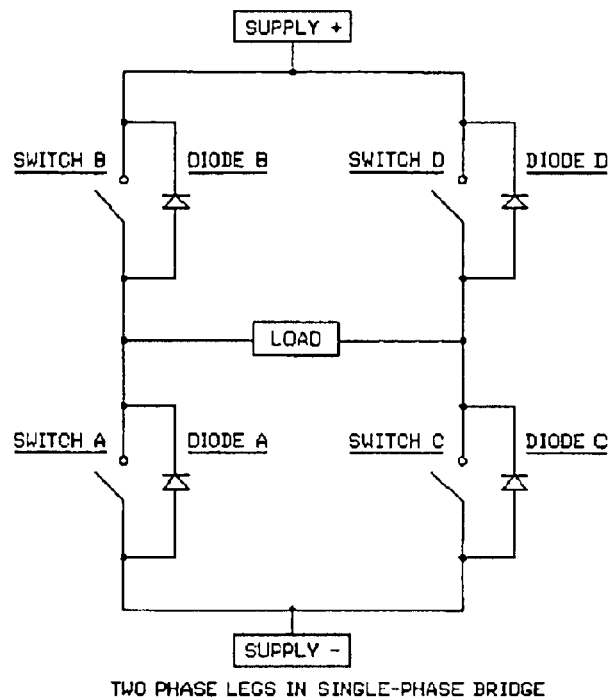
FIG. 7B shows a Single-Phase Bridge Circuit.
Figure 8:
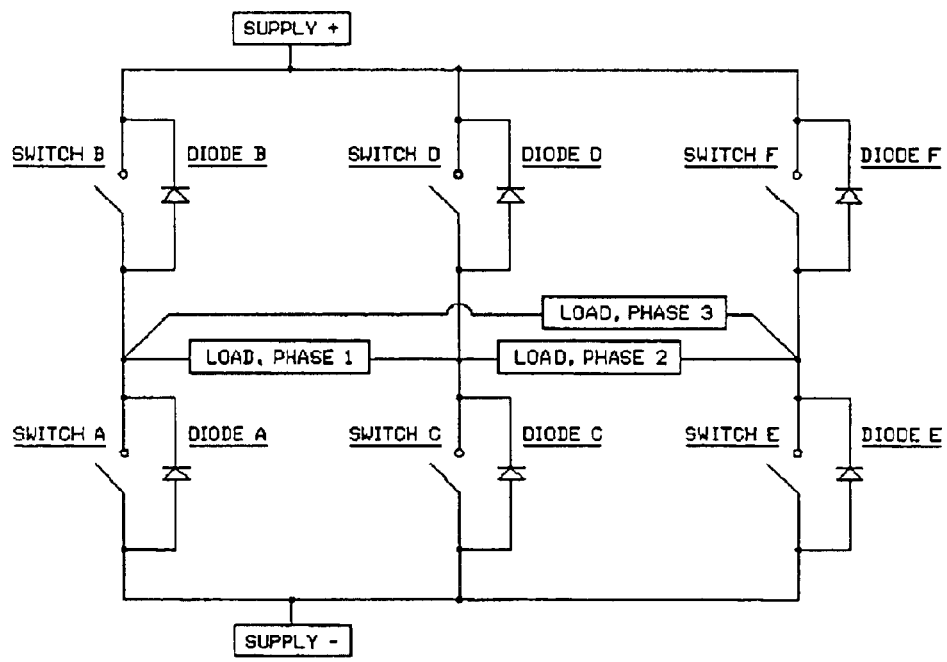
FIG. 8 shows Three Phase-Legs in a Three-Phase Bridge Circuit.
Figure 9:
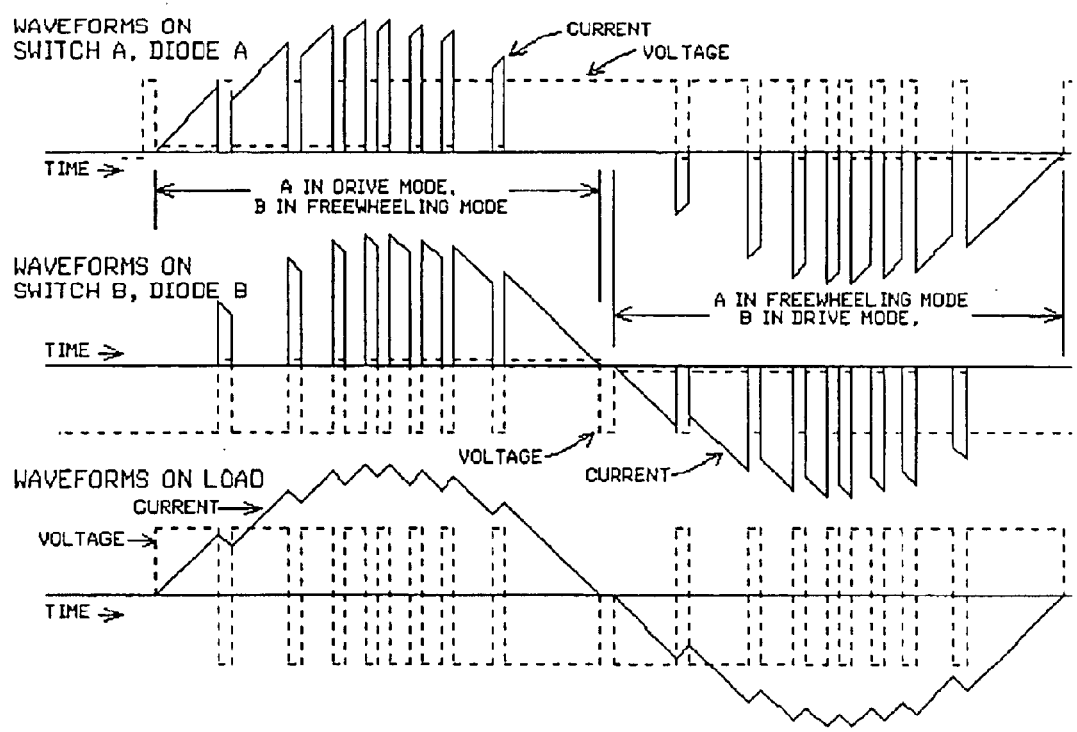
FIG. 9 shows Waveforms used to Generate Quasi-Sinusoidal Load Current from a Single-Phase Bridge.
Figure 10:
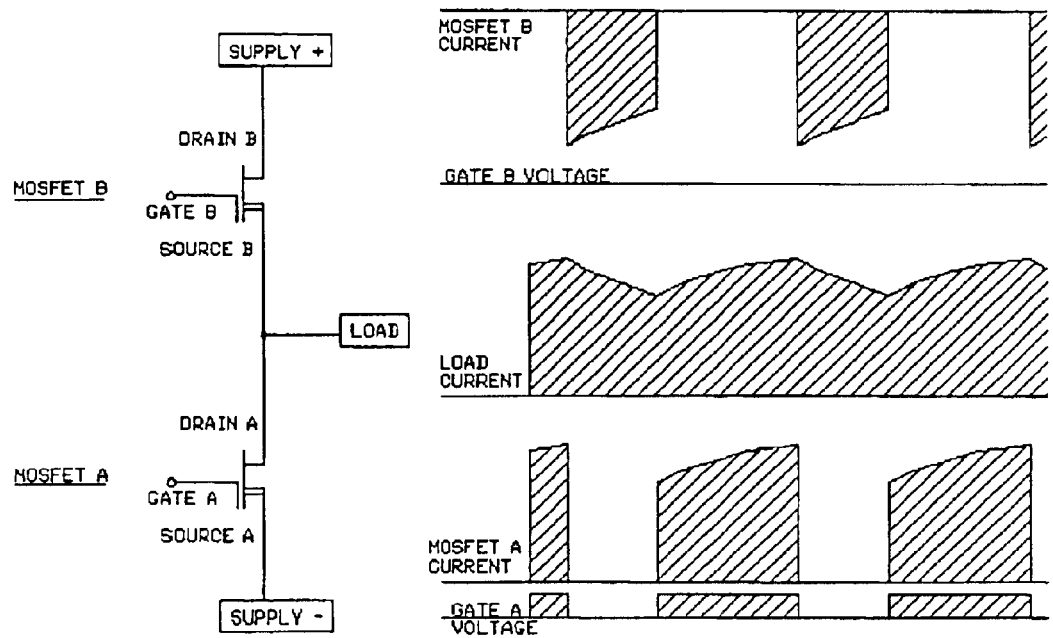
FIG. 10 shows a Phase-Leg using only MOSFETs, with Waveforms when MOSFET A is in Drive Mode.
Figure 11:
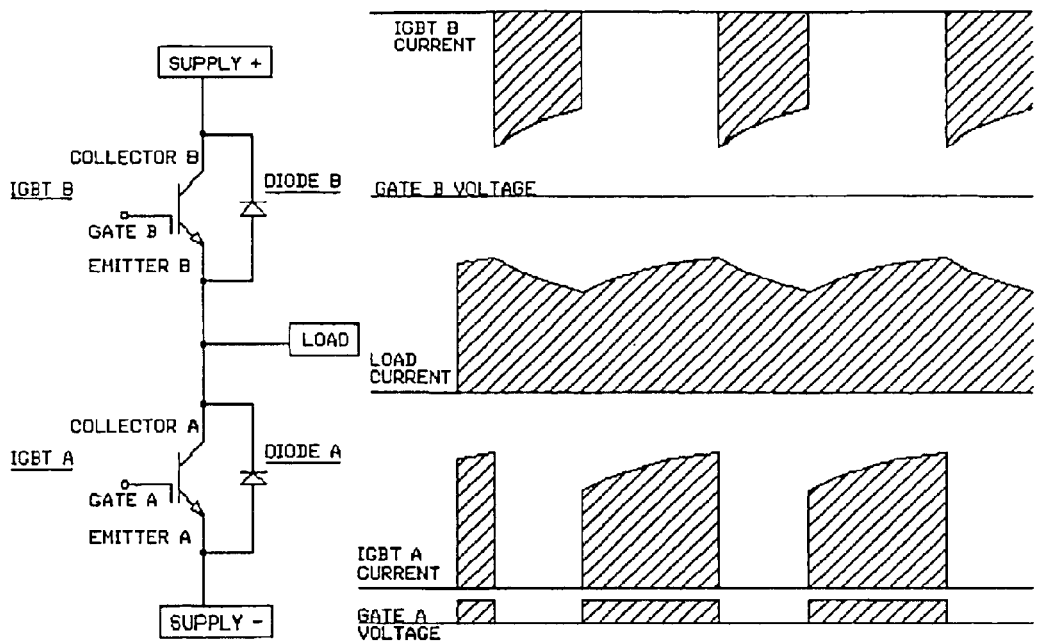
FIG. 11 shows a Phase-Leg using IGBTs and Diodes.
Figure 12:
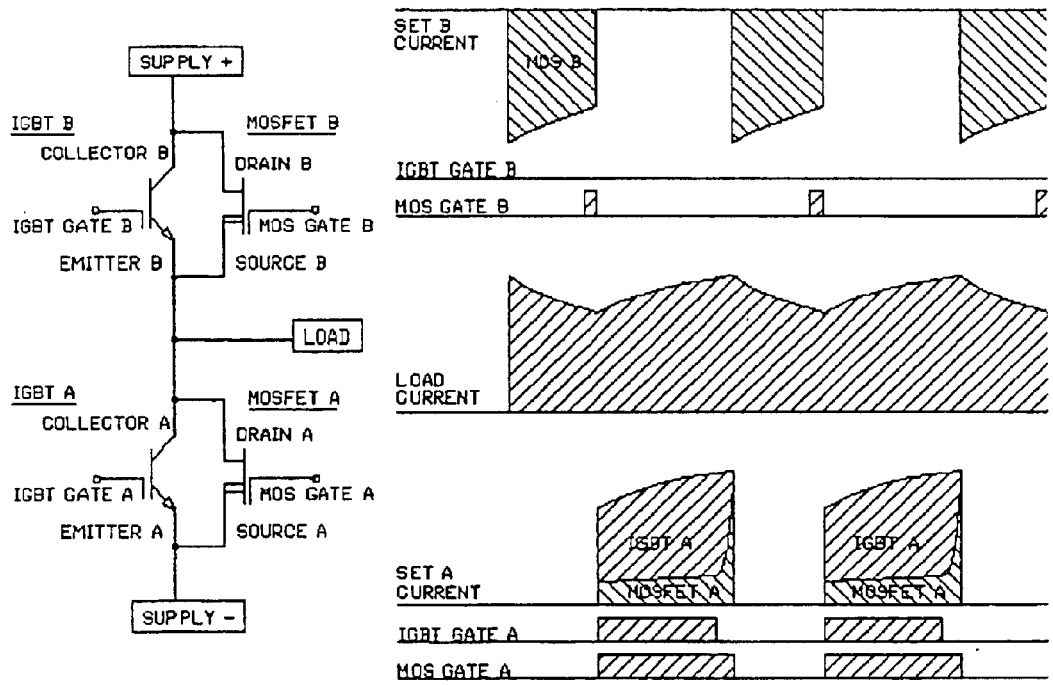
FIG. 12 shows an IGBT Phase-Leg with Diodes replaced by MOSFETs, to reduce Turn-On Losses.
Figure 13:
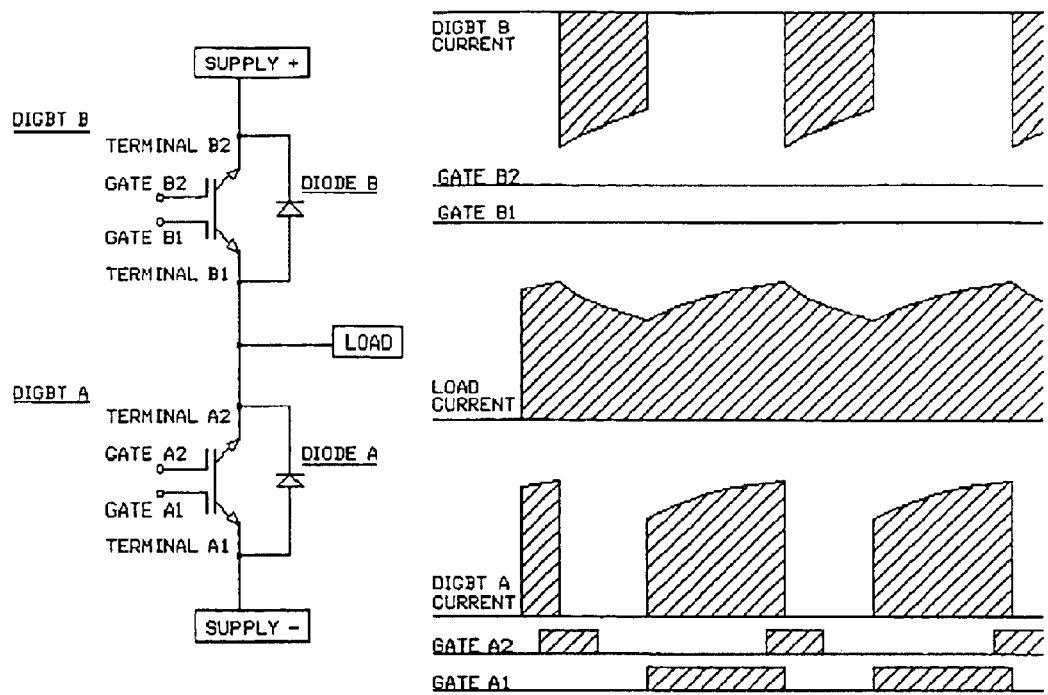
FIG. 13 shows a phase leg with Diodes with the IGBT replaced with DIGBTs to reduce Turn-Off Losses.
Figure 14:
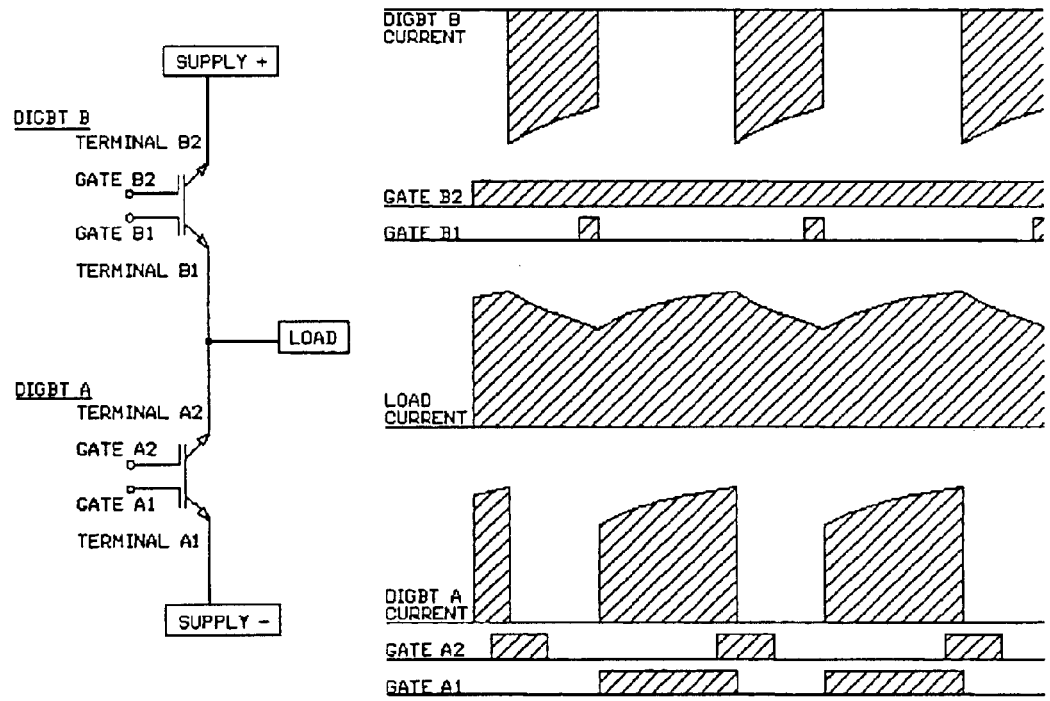
FIG. 14 shows a Phase-Leg using only DIGBTs where the DIGBT perform transistor switching and freewheeling diode functions.

In a first example embodiment the DIGBT (double-side insulated gate bipolar transistor) is configured to function as a transistor switch and as a freewheeling diode. Referring to FIG. 14, which shows a semiconductor half bridge circuit 1400, constructed according to the first embodiment in which one DIGBT is used as a switch while the other may be used as freewheeling diode.

The circuit shows a semiconductor half bridge circuit having a first DIGBT 1410 featuring first 1412 and second terminals 1414 and first 1416 and second gates 1418. The first gate 1416 is also known as the primary gate while the second gate 1418 is also referred to as the secondary gate.

The primary gate is the gate of the DIGBT that controls the turn-on and turn-on of current flow in the DIGBT by controlling the turn-on and turn-off of an MOSFET that injects majority carriers into the base of DIGBT. For an DIGBT with an N-type base region, the primary gate is on the same side of the DIGBT as the cathode terminal. The base of a DIGBT is the wide center region of a DIGBT in which a wide depletion layer forms to allow a large blocking voltage to be established without avalanche breakdown in the DIGBT with the DIGBT is in the off-state and a large value blocking voltage is established across the terminals of the DIGBT.

The secondary gate is the gate of the DIGBT that controls the injection of minority carriers into the base of the DIGBT. For an DIGBT with an N-type base region, the secondary gate is on the same side of the DIGBT as the anode terminal.

With continued reference to FIG. 14, the first terminal 1412 is operatively coupled to a load 1444, and the second terminal 1414 is coupled to a supply voltage having a positive bias 1450. The primary 1418 and secondary gates 1416 are each operatively coupled to means for supplying gate signals to the transistor (not shown). The means for supplying gate signals is not limiting of this invention and may be one many known to those skilled in the art. The second DIGBT 1420 has first 1422 and second terminals 1424 and a primary gate 1422, (gate A1) and a secondary gate 1424 (gate A2). The second terminal of the second DIGBT, 1424 (terminal A2) is operatively coupled to load 1444 and the first terminal of the first DIGBT (terminal B1) 1412 through a common node. The first terminal of the second DIGBT 1422 is coupled to a supply voltage having a negative bias 1451, while the primary gate 1426 and the secondary gate 1428 of the second DIGBT 1420 are each operatively coupled to means for supplying gate signals (not shown).

In the phase-leg shown in FIG. 14, which is the subject of this embodiment, there are no separate freewheeling diodes because the DIGBTs are supplied with gate signals such that they perform both the switching function and the freewheeling function.

In operation the first 1410 and second DIGBTs 1420 are supplied with gate signals such that when the first DIGBT 1410 is performing a transistor switching function the second DIGBT 1420 is performing a freewheeling diode function and when the second DIGBT 1420 is performing a transistor switching function, the first DIGBT 1410 is performing a freewheeling diode function.

Specifically when the second DIGBT 1420 performs a transistor switching function, the first DIGBT 1410 performs a freewheeling diode function. As shown in the FIG. 14 state diagram, when the primary gate 1426 of the second DIGBT (A1) is being turned on and off as a transistor switch the first DIGBT 1410 is freewheeling. On each cycle of the second DIGBT's primary gate (A1) 1426, the second DIGBT's secondary gate 1428 (A2) is being turned on for a short time just before the end of each on-period for the second DIGBTs primary gate 1426. During the switching cycle gate the first DIGBT's secondary gate (B2) 1418 remains on. The primary gate for the first DIGBT (B1) 1416, is turned on for a short time just before, coincident to, or just after the end of each second DIGBT primary gate (A1) 1422 off-period, which enables the first DIGBT 1410 to perform the freewheeling function with minimum turn-on dissipation in the circuit.

When the first DIGBT 1410 is performing the transistor switching function, the second DIGBT 1420 performs the freewheeling function. In this embodiment the first DIGBT's primary gate (B1) 1416 is being turned on and off, as a conventional transistor switch. On each cycle of the primary gate (B1) 1416, the secondary gate (B2) 1418 is being turned on for a short time just before the end of each gate (B1) 1416 on-period. During the gate (B1) switching cycle gate the second DIGBT's secondary gate (A2) 1428 remains on, and the second DIGBT's primary gate (A1) 1426 is turned on for a short time just before the end of each primary gate (B1) 1416 off-period. This enables the second DIGBT 1420 to perform the freewheeling function with minimum turn-on dissipation in the circuit.

In the circuit shown in FIG. 14, conduction losses are minimized by the use of bipolar conduction, turn-off losses are minimized by the use of the secondary gate 1428 to reduce stored charge at the end of each drive conduction pulse, and turn-on losses are minimized by the use of the primary gate 1416 to reduce stored charge in the first DIGBT at the end of each freewheeling conduction pulse.

One of the possible drawbacks with the DIGBT circuit of FIG. 14 is that if there is a of disruption of the gate signals, the DIGBTs may not be able to dissipate the stored energy because, in the absence of gate signals, the DIGBTs will block the current flow in both directions. Without gate signals, the DIGBTs will not conduct until the inductor drives the voltage up to the avalanche breakdown voltage, which may or may not be safe for the circuit.

Figure 15:
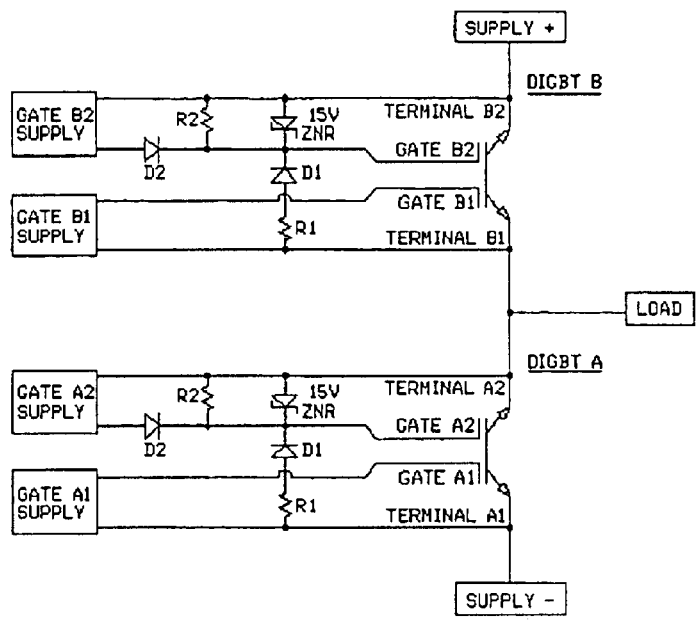
FIG. 15 shows a DIGBT Phase-Leg without Diodes, with Fault-Protection Circuit.

FIG. 15 shows a circuit which solves the above avalanche breakdown voltage problem by providing over-voltage self-protection for the DIGBTs. In this example embodiment a DIGBT half phase leg 1500 is employed with a protection circuit 1501 for the DIGBT used as freewheeling a diode. In addition to providing the freewheeling function, diodes in parallel with the switches provide a fault-protection function. If a disruption of the gate signals occurs while there is energy stored in the inductive load, one or the other of the diodes is always ready to become forward biased such that this energy can be safely dissipated or shunted back to the supply.

The circuit of FIG. 15 is similar to the phase-leg shown in FIG. 14 but includes a DIGBT protection circuit. Means for activating the DIGBTs are gate supplies, (A1), (A2), (B1) and (B2), 1533, 1532, 1531 and 1530. These gate supplies are operatively coupled to the transistor gates 1526, 1528, 1516 and 1518, through a fault protection circuit 1501. The fault protection circuit features diode D2, 1580 connecting first B2 gate supply, 1530 to the secondary gate of the first DIGBT (B2), 1518. Resistor R2, 1560 and zener diode Z1, 1570 are connected in parallel with gate B2, 1518 and Terminal B2, 1514. The Gate B1 supply, 1531 is connected to primary gate B1, 1516 and terminal B1, 1512. Resistor R1, 1563 is connected to terminal B1, 1516 and secondary gate B2, 1518 through Diode D1, 1582. Diode D2, 1580 connects A2 gate supply, 1532 to secondary gate A2, 1528. Resistor R2, 1561 and zener diode Z1, 1571 are connected in parallel with secondary gate A2, 1528 and Terminal A2, 1525. The Gate A1 supply 1533 is connected to primary gate A1 1526 and terminal A1 1522. Resistor R1 1564 is connected to terminal A1, 1526 and secondary gate A2, 1528 through Diode D1, 1583.

If for some reason during the use of the circuit Terminal 2 (T2), 1514, 1524 goes negative with respect to Terminal 1 (T1), 1512, 1522 diode D1, 1582, 1583 becomes forward biased and applies a positive bias to the secondary gate (G2), 1518, 1528. When this bias reaches the G2 threshold voltage, current flows through the DIGBT, 1510, 1520 in the direction from T1, to T2. The zener diodes limit the voltage applied to the secondary gates, protecting the gate oxide from being damaged by excess voltage. Resistor R1, 1563, 1564 limits the current through the zener, 1570, 1571 and the primary gates, to a safe value and resistor R2, 1560, 1561 allows the secondary gates, to discharge after the fault. Diode D2, 1581, 1581 prevents the turn-on bias of the fault from leaking out through the gate circuit.

In operation, this circuit senses the 3rd-quadrant voltage on the DIGBTs, and uses it to turn on gate 2 so that any stored energy can be dissipated. When the device is turned on by this circuit, current will flow through it at a voltage drop of approximately the gate threshold voltage, typically around 5 to 6 volts. Although this is-higher than the normal on-voltage, it is low enough to dissipate any stored energy at a voltage which is safe for the devices and the circuit.

The mechanism by which this circuit provides protection is that if Terminal 2 (T2) goes negative with respect to Terminal 1 (T1), diode D1 becomes forward biased and applies a positive bias to gate 2 (G2). When this bias reaches the G2 threshold voltage, it allows current to flow through the DIGBT in the direction from T1 to T2. The 15 volt zener diode limits the voltage which can be applied to G2, to protect the gate oxide from being damaged by excess voltage. Resistor R1 limits the current through the zener and D1 to a safe value. Resistor R2 allows G2 to discharge after the fault, and diode D2 prevents the turn-on bias of the fault from leaking out through the gate circuit.

All components of this protection circuit are low-power, low-cost components, because they carry only the low currents needed to activate G2. Diode D1 must support the same high voltage as the DIGBT, but it also is low cost because it carries only low current, and has no special requirements on switching speed.

In yet another example embodiment DIGBT structure may be employed which features 3rd quadrant avalanche-energy capability for fault-protection. In general phase-leg circuits require the switch to have a high voltage-blocking capability in the 1st-quadrant, but require no 3rd-quadrant blocking capability. Therefore, another way to provide the DIGBT with fault-protection capability is to build it with a low avalanche breakdown voltage in the 3rd quadrant.

Figure 16:
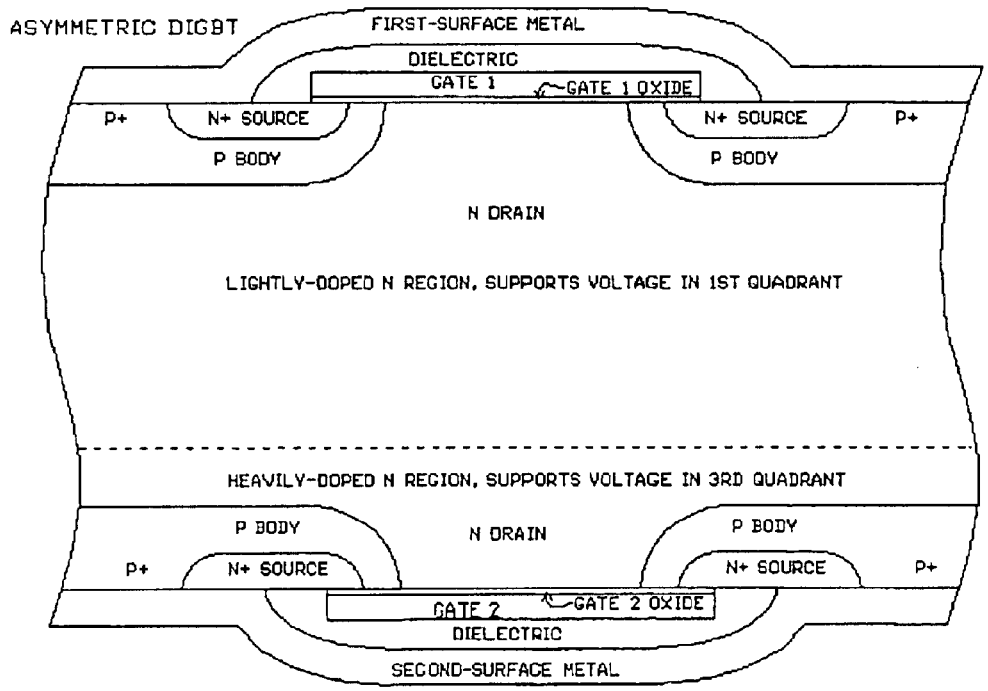
FIG. 16 shows an Asymmetric DIGBT, with a High Breakdown Voltage in 1st Quadrant, and a Low Breakdown Voltage in 3rd Quadrant.

FIG. 16 shows an N-channel enhancement-mode DIGBT structure 1600 incorporating such a reduced 3rd-quadrant blocking capability. This is achieved by using a much higher N dopant concentration in the central N drain region near the second-surface junction 1602 than near the first-surface junction 1601. In order to assure that the device can safely handle the avalanche energy produced by the fault, it must have an appropriate voltage-termination structure on this low-voltage second-surface junction.

More specifically, this is achieved by employing a DIGBT with an asymmetric structure as shown in FIG. 16. This DIGBT employs a structure with a N type semiconductor substrate, 1600 forming a first, 1610 and second N drain 1620, and a P type region 1630 adjacent to each side of the first 1610 and second N drain regions 1620 forming a P+ type body 1630. A N+ type source 1640 is formed on the surface of each P+ type body 1630 and first 1650 and second oxide gates 1655 are formed on each of the N drain regions 1610, 1620, overlapping a portion of the P+ type body 1630 and extending to overlap a portion of the N+ source 1640. A dielectric material 1660, 1665 is used to insulate the top of each of the oxide gates 1650, 1655. A first surface metal 1670 is positioned adjacent to the dielectric material 1660 insulating the first oxide gate 1650, overlapping the N+ source 1640 and extending to the exposed region of the P+ body 1630 forming a first surface junction 1601. A second surface metal 1675 is positioned adjacent to the dielectric material 1665 insulating the second oxide gate 1655, overlapping the N+ source 1645 and extending to the exposed region of the P+ body 1635 forming a second surface junction 1602. The portion of the N type substrate forming the second N drain 1620 has a higher N dopant concentration in the central N drain region near the second-surface junction 1602 than near the first-surface junction 1601. This DIGBT has a low avalanche breakdown voltage in the 3rd quadrant and upon activation of the second gate 1655 hole-injection is efficiently suppressed resulting in less stored charge and reduced turn-off time.

This heavily-doped N layer provides an additional benefit to device performance in terms of a reduced turn-off time. The higher conductivity of this N layer reduces the resistance of the path through which electrons flow when gate 2 is turned on to stop hole injection. The result is that hole-injection can be suppressed more quickly, and can be suppressed up to higher current levels, resulting in less stored charge and reduced turn-off time, particularly at high currents.

In yet another example embodiment a DIGBT with a depletion-mode second gate for Fault-Protection may be employed. In this embodiment the DIGBT is constructed in such a way that gate 2 is normally on, rather than normally off, i.e. gate 2 is a depletion-mode gate rather than an enhancement-mode gate. This approach allows the fault currents to flow at only the normal diode voltage drop of 1 to 2 volts, rather than at the threshold drop of 5 to 6 volts, or the reduced 3rd-quadrant-voltage drop of 20 to 30 volts.

Figure 17:
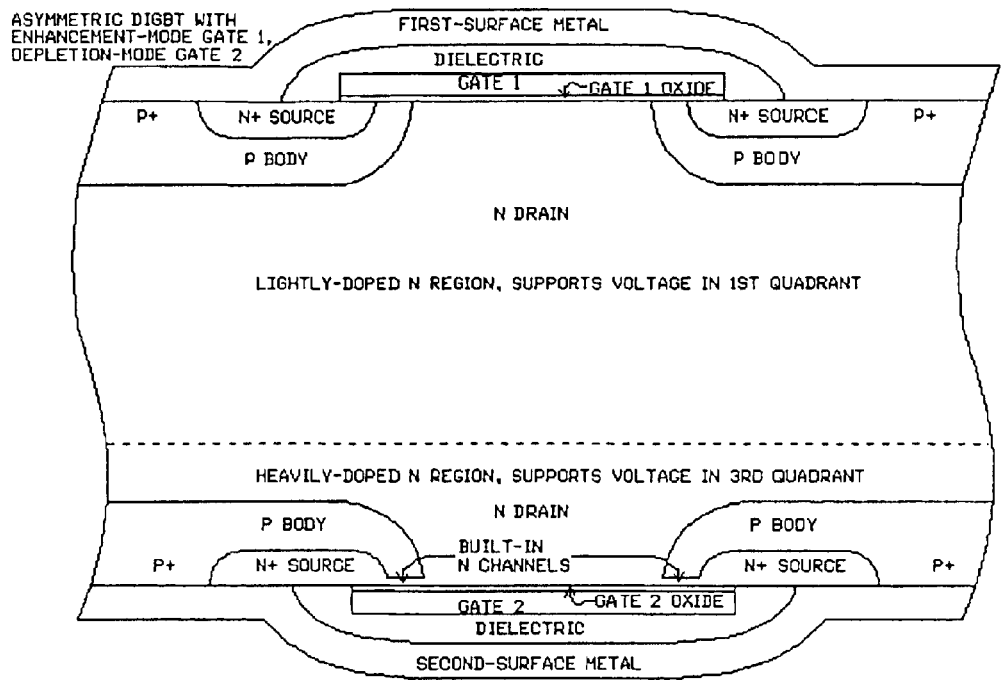
FIG. 17 shows a DIGBT with Depletion-Mode Channels on Gate 2.

FIG. 17 shows an N-channel DIGBT 1700 constructed in this way. This can be accomplished by constructing an asymmetric DIGBT wherein the N+ source 1745 is formed on the P body 1735 adjacent to the second oxide gate 1755 and covers the portion of the P body 1735 adjacent to the second oxide gate 1755. This feature creates built in N type channels 1717 for operation of the second gate 1755 in the depletion mode.

This device also includes the heavily-doped N layer 1720 adjacent the second surface 1775, to provide the turn-off benefit noted above, and to give the device a back-up means of fault protection. Since this layer also provides a reduced 3rd-quadrant breakdown, it assures that the device will still have fault-protection even if a fault should occur at a time when gate 2 has a turn-off bias.

Figure 18:
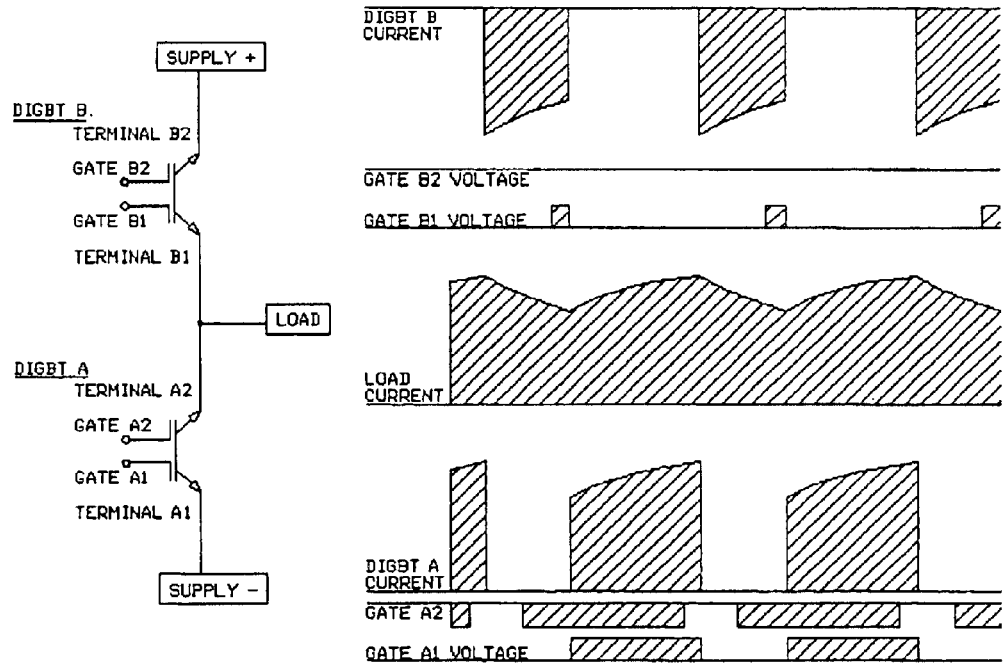
FIG. 18 shows a DIGBT Phase-Leg with Waveforms for Gate 2 having Depletion-Mode Structure.

Gate signal timing for this device is the same as for the all-enhancement-mode devices, except that the G2 signal would be displaced. For example, for a device with both gates enhancement-mode, during the switch-conduction phase, G1 might be at +15 volts and gate 2 at zero, and then G2 might go to +15 volts during the last 3 microseconds of the time G1 is at +15 volts, to suppress hole injection during the final 3 microseconds. For the device with G1 enhancement and G2 depletion, during the switch-conduction phase, G1 would still be at +15 volts, but G2 would be at −15 volts in order to produce hole injection. Then, G2 would drop to zero to suppress hole injection for the last 3 microseconds that G1 is on. FIG. 18 shows examples of timing signals for such a device.

Although this invention has be described in relation to the exemplary embodiment's thereof, it is well understood by those skilled in the art that other variations and modifications can be affected on the preferred embodiment without departing from the scope and the spirit of the invention as set fourth in the claims.

What is claimed is:

1. A half-bridge circuit comprising
a first DIGBT (double-side insulated gate bipolar transistor) having a first and second terminals and a primary gate and a secondary gate, the first terminal is coupled to a load, the second terminal is coupled to a supply voltage having a positive bias, the primary and secondary gates are each operatively coupled to means for supplying gate signals to said transistor,
a second DIGBT having first and second terminals and a primary gate and a secondary gate, the second terminal of the second DIGBT is operatively coupled to the load and the first terminal of the first DIGBT through a common node,
the first terminal of the second DIGBT is coupled to a supply voltage having a negative bias,
the primary gate and the secondary gate of the second DIGBT are each operatively coupled to means for supplying gate signals,
wherein the first and second DIGBTs are supplied with gate signals such that when the first DIGBT is performing a transistor switching function the second DIGBT is performing a freewheeling diode function and when the second DIGBT is performing a transistor switching function, the first DIGBT is performing a freewheeling diode function.

2. The circuit of claim 1 wherein the second DIGBT performs a transistor switching function, and the first DIGBT performs a freewheeling diode function, wherein the second DIGBT's primary gate is being turned on and off, and during the switching cycle of the second DIGBT the secondary gate of the first DIGBT remains on which enables the first DIGBT to perform the freewheeling function in the circuit.

3. The circuit of claim 1 wherein the second DIGBT performs a transistor switching function, and the first DIGBT performs a freewheeling diode function, wherein the second DIGBT primary gate is being turned on and off, and during the switching cycle of the second DIGBT the secondary gate of the first DIGBT remains on, and the first DIGBT primary gate is turned on for a short time just before the end of each second DIGBT primary gate off period which enables the first DIGBT to perform the freewheeling function with minimum turn on dissipation in the circuit.

4. The circuit of claim 3 wherein the first DIGBT primary gate is turned on for a short time just before the end of each second DIGBT primary gate off period, and the first DIGBT primary gate is turned off just before.

5. The circuit of claim 3 wherein the first DIGBT primary gate is turned on for a short time just before the end of each second DIGBT primary gate off period, and the first DIGBT primary gate is turned off, coincident to each second DIGBT primary gate off period.

6. The circuit of claim 3 wherein the first DIGBT primary gate is turned on for a short time just before the end of each second DIGBT primary gate off period, and the first DIGBT primary gate is turned off just after each second DIGBT primary gate off period.

7. The circuit of claim 1 wherein the second DIGBT performs a transistor switching function, and the first-DIGBT performs a freewheeling diode function, wherein the second DIGBT primary gate is being turned on and off, and on each cycle of the second DIGBT primary gate, the second DIGBT secondary gate is being turned on for a short time just before the end of each second DIGBT primary gate on period, and during the switching cycle of the second DIGBT the primary gate the first DIGBT secondary gate remains on which enables the first DIGBT to perform the freewheeling function in the circuit.

8. The circuit of claim 1 wherein the second DIGBT is performs a transistor switching function, and the first DIGBT performs a freewheeling diode function, wherein the second DIGBT primary gate is being turned on and off, and on each cycle of the second DIGBT primary gate, the second DIGBT secondary gate is being turned on for a short time just before the end of each second DIGBT primary gate on period, and during the switching cycle of the second DIGBT the primary gate the first DIGBT secondary gate remains on, and the first DIGBT primary gate is turned on for a short time just before the end of each second DIGBT primary gate off period which enables the first DIGBT to perform the freewheeling function with minimum turn on dissipation in the circuit.

9. The circuit of claim 1 wherein the first DIGBT is performs the switching function, and the second DIGBT is performs the freewheeling function wherein gate B1 is being turned on and off, and on each cycle of the primary gate of the first DIGBT, the secondary gate of the first DIGBT is being turned on for a short time just before the end of each primary gate on-period, during the switching cycle the secondary gate of the second DIGBT remains on, and the primary gate of the second DIGBT is turned on for a short time just before the end of each primary gate for the first DIGBT off-period which enables the second DIGBT to perform the freewheeling function with minimum turn-on dissipation in the circuit.

10. The circuit of claim 8 wherein the first DIGBT is performs the switching function, and the second DIGBT is performs the freewheeling function wherein gate B1 is being turned on and off, and on each cycle of the primary gate of the first DIGBT, the secondary gate of the first DIGBT is being turned on for a short time just before the end of each primary gate on-period, during the switching cycle the secondary gate of the second DIGBT remains on, and the primary gate of the second DIGBT is turned on for a short time just before the end of each primary gate for the first DIGBT off-period which enables the second DIGBT to perform the freewheeling function with minimum turn-on dissipation in the circuit.

11. The device of claim 1 wherein means for activating said transistors are gate supplies, A1, A2, B1 and B2, coupled to the transistor gates through a fault protection circuit comprising:

diode D2 connecting the first B2 gate supply to the secondary gate (B2) of the first DIGBT, resistor R2 and zener diode Z1, connected in parallel with the secondary gate (B2) of the first DIGBT and Terminal B2, Gate B1 supply connected to the first DIGBT's primary gate (B1) and terminal B1, resistor R1 connected to terminal B1 and the secondary gate of the first DIGBT (B2) through Diode D1, diode D2 connecting the A2 gate supply to the second DIGBT's secondary gate (A2), resistor R2 and zener diode Z1 connected in parallel with the secondary gate on the second DIGBT (A2) and Terminal A2, Gate A1 supply connected to the primary gate of the second DIGBT (A1) and terminal A1, and, resistor R1 connected to terminal A1 and the Second DIGBT's secondary gate (A2) through Diode D1, wherein if Terminal 2 (T2) goes negative with respect to Terminal 1 (T1), diode D1 becomes forward biased and applies a positive bias to the secondary gate (G2), when this bias reaches the G2 threshold voltage, current flows through the DIGBT in the direction from T1 to T2, the zener diodes limit the voltage applied to G2, protecting the gate oxide from being damaged by excess voltage, resistor R1 limits the current through the zener and D1 to a safe value, resistor R2 allows G2 to discharge after the fault, and diode D2 prevents the turn-on bias of the fault from leaking out through the gate circuit.

* * * * *